US012765266B2

(12) United States Patent
Huang et al.

(10) Patent No.: US 12,765,266 B2
(45) Date of Patent: Oct. 13, 2026

(54) MAGNETIC TUNNEL JUNCTION (MTJ) HAVING A DIFFUSION BLOCKING SPACER LAYER

(71) Applicant: Taiwan Semiconductor Manufacturing Company, Ltd., Hsinchu (TW)

(72) Inventors: Kuo-Feng Huang, Hsinchu City (TW); Bo-Hung Lin, Kaohsiung City (TW); Harry-Haklay Chuang, Zhubei City (TW); Kuei-Hung Shen, Hsinchu City (TW); Ding-Shuo Wang, Hsinchu County (TW); Yu-Jen Wang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 646 days.

(21) Appl. No.: 18/164,845

(22) Filed: Feb. 6, 2023

(65) Prior Publication Data

US 2024/0268236 A1 Aug. 8, 2024

(51) Int. Cl.

*H10N 50/10* (2023.01)
*G11C 11/16* (2006.01)
*H01F 10/32* (2006.01)
*H10N 50/01* (2023.01)
*H10N 50/85* (2023.01)

(52) U.S. Cl.

CPC ........... *H10N 50/10* (2023.02); *G11C 11/161* (2013.01); *H01F 10/3254* (2013.01); *H10N 50/01* (2023.02); *H10N 50/85* (2023.02)

(58) Field of Classification Search

CPC ........ H10N 50/10; H10N 50/01; H10N 50/85; G11C 11/161; H01F 10/3254

See application file for complete search history.

(56) References Cited

U.S. PATENT DOCUMENTS

| | | | | |
|---|---|---|---|---|
| 8,492,859 | B2 | 7/2013 | Hu | |
| 2014/0054660 | A1* | 2/2014 | Suguro | H10N 50/01 438/795 |
| 2014/0346624 | A1* | 11/2014 | Shoji | H10N 50/01 257/421 |
| 2015/0035095 | A1 | 2/2015 | Kim et al. | |
| 2019/0334079 | A1 | 10/2019 | Rahman et al. | |

(Continued)

OTHER PUBLICATIONS

Liu et al. "Thermal stability of magnetic tunneling junctions with MgO barriers for high temperature spintronics" Applied Physics Letters 89, 023504 (2006), published on Jul. 11, 2006.

(Continued)

*Primary Examiner* — Jay C Kim
*Assistant Examiner* — Woo K Lee
(74) *Attorney, Agent, or Firm* — Eschweiler & Potashnik, LLC

(57) ABSTRACT

An integrated chip including a reference magnetic layer and a barrier layer over the reference magnetic layer. A first free magnetic layer is over the barrier layer. A second free magnetic layer is over the first free magnetic layer. A spacer layer is between the first free magnetic layer and the second free magnetic layer. The spacer layer includes magnesium and a transition metal. An atomic ratio of the magnesium to the transition metal ranges from 15% to 80%.

20 Claims, 7 Drawing Sheets

(56) References Cited

U.S. PATENT DOCUMENTS

2020/0106001 A1 4/2020 Gupta et al.
2022/0376172 A1* 11/2022 Wang .................. H10D 48/385

OTHER PUBLICATIONS

Beek et al. "Thermal stability analysis and modelling of advanced perpendicular magnetic tunnel junctions" AIP Advances 8, 055909 (2018), published on Dec. 18, 2017.
Couet et al. "Impact of Ta and W-based spacers in double MgO STT-MRAM free layers on perpendicular anisotropy and damping" Appl. Phys. Lett. 111, 152406 (2017); doi: 10.1063/1.5000992, published on Oct. 11, 2017.

* cited by examiner

MAGNETIC TUNNEL JUNCTION (MTJ) HAVING A DIFFUSION BLOCKING SPACER LAYER

BACKGROUND

Many modern day electronic devices contain electronic memory. Electronic memory may be volatile memory or non-volatile memory. Non-volatile memory is able to store data in the absence of power, whereas volatile memory is not. Some examples of next generation electronic memory include magnetoresistive random-access memory (MRAM), resistive random-access memory (RRAM), phase-change random-access memory (PCRAM), and conductive-bridging random-access memory (CBRAM).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
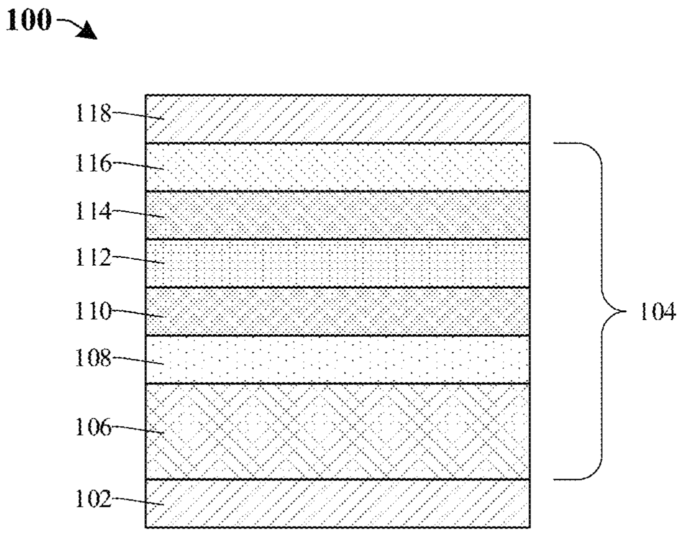
FIG. 1 illustrates a cross-sectional view of some embodiments of a memory device comprising a magnetic tunnel junction (MTJ), the MTJ comprising a spacer layer between a first free magnetic layer and a second free magnetic layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip includes a magnetic tunnel junction (MTJ) memory device. The magnetic tunnel junction includes a reference magnetic layer (e.g., a pinned or fixed magnetic layer), a free magnetic layer over the reference magnetic layer, and a barrier layer directly between the reference magnetic layer and the free magnetic layer. The free magnetic layer includes a first sublayer and a second sublayer. A spacer layer is disposed within the free magnetic layer directly between the first free magnetic sublayer and the second free magnetic sublayer. The spacer layer includes a transition metal such as, for example, tungsten, molybdenum, tantalum, hafnium, or the like. Back-end-of-line (BEOL) interconnects (e.g., metal lines, metal vias, or the like) are arranged over the MTJ.

During the formation of the BEOL interconnects, the MTJ is exposed to high temperatures (e.g., greater than 400 degrees Celsius). This high temperature exposure can cause atoms to diffuse out of the first free magnetic sublayer. This diffusion can reduce the data retention ability of the MTJ. Thus, the spacer layer is included over the first free magnetic sublayer to block atoms from diffusing out of the first free magnetic sublayer, thereby improving a thermal stability of the MTJ. The diffusion blocking ability of the spacer layer corresponds to the thickness of the spacer layer. For example, increasing the thickness of the spacer layer can improve the diffusion blocking ability of the spacer layer. However, as the thickness of the spacer layer is increased, the magnetic coupling between the free magnetic sublayers may be reduced. Consequently, a performance of the MTJ may be reduced.

In various embodiments of the present disclosure, the spacer layer further includes magnesium to improve the thermal stability of the MTJ without substantially reducing the magnetic coupling between the free magnetic sublayers. For example, in addition to a transition metal, the spacer layer further comprises magnesium, which has relatively low impact on the magnetic coupling between the free magnetic sublayers. Thus, by adding magnesium to the spacer layer, the thickness of spacer layer can be increased without reducing the magnetic coupling between the free magnetic sublayers. By increasing thickness of the spacer layer, the diffusion blocking ability of the spacer layer can be improved. By improving the diffusion blocking ability of the spacer layer, the thermal stability of the MTJ can be improved.

FIG. 1 illustrates a cross-sectional view 100 of some embodiments of a memory device comprising a magnetic tunnel junction (MTJ) 104, the MTJ 104 comprising a spacer layer 112 between a first free magnetic layer 110 and a second free magnetic layer 114.

The MTJ 104 is between a first electrode layer 102 and a second electrode layer 118. The MTJ 104 comprises a reference magnetic layer 106, a barrier layer 108, the first free magnetic layer 110, the spacer layer 112, the second free magnetic layer 114, and a cap layer 116. In some embodiments, the MTJ 104 is disposed over a substrate (e.g., 502 of FIG. 5 and FIG. 6) and within one or more dielectric layers (e.g., 516 of FIG. 5 and FIG. 6). The reference magnetic layer 106 is over the first electrode layer 102. The first free magnetic layer 110 is over the reference magnetic layer 106. The barrier layer 108 is directly between the reference magnetic layer 106 and the first free magnetic layer 110. The second free magnetic layer 114 is over the first free magnetic layer 110. The spacer layer 112 is directly between the first free magnetic layer 110 and the second free magnetic layer 114. The cap layer 116 is over the second free magnetic layer 114. The second electrode layer 118 is over the cap layer 116. Back-end-of-line (BEOL) interconnects (e.g., 1304 of FIG. 13) are over the MTJ 104.

The reference magnetic layer 106 has a fixed (e.g., pinned) magnetic orientation. The first free magnetic layer 110 and the second free magnetic layer 114 have free (e.g., variable) magnetic orientations. The magnetic orientations of the free magnetic layers 110, 114 can be controlled by passing current through the MTJ 104. The resistance of the MTJ 104 changes based on the magnetic orientations of the free magnetic layers 110, 114 relative to the magnetic orientation of the reference magnetic layer 106. The resistance of the MTJ 104 indicates the data (e.g., the value) stored by the MTJ 104.

In some embodiments, the first free magnetic layer 110 comprises cobalt-iron-boron (e.g., CoFeB) or some other suitable ferromagnetic material. In some instances, boron atoms can diffuse out of the first free magnetic layer 110 (e.g., towards the top of the MTJ 104) when the MTJ 104 is exposed to high temperatures (e.g., greater than 400 degrees Celsius) during the formation of the BEOL interconnects over the MTJ 104. When boron atoms diffuse out of the first free magnetic layer 110, the crystallinity of the first free magnetic layer 110 increases. If the first free magnetic layer becomes too crystalline (e.g., if the crystallinity of the first free magnetic layer 110 surpasses some optimal crystallinity threshold), the data retention (e.g., the perpendicular magnetic anisotropy (PMA) and/or the energy barrier) of the MTJ 104 can be reduced. Thus, the spacer layer 112 is included over the first free magnetic layer 110 to impede the diffusion of boron out of the first free magnetic layer 110. By impeding the diffusion of boron atoms out of the first free magnetic layer 110, the thermal stability of the MTJ 104 can be improved. For example, the amount of time that the MTJ 104 can be exposed to high temperatures (e.g., during BEOL interconnect formation) can be increased without the MTJ 104 experiencing substantial data retention degradation.

The spacer layer 112 comprises magnesium and one or more transition metals (e.g., tungsten, molybdenum, tantalum, hafnium, or the like). By including magnesium in the spacer layer 112, the ability of the spacer layer 112 to block boron atoms from diffusing out of the first free magnetic layer 110 can be improved (e.g., the speed at which boron atoms diffuse out of the first free magnetic layer 110 can be reduced) without substantially reducing magnetic coupling between the first free magnetic layer 110 and the second free magnetic layer 114. For example, magnesium has a relatively low impact on the magnetic coupling between the free magnetic layers 110, 114. Thus, by adding magnesium to the spacer layer 112, the thickness of spacer layer 112 can be increased without substantially reducing the magnetic coupling between the free magnetic layers 110, 114. By increasing the thickness of the spacer layer 112, the diffusion blocking ability of the spacer layer 112 can be improved. By improving the diffusion blocking ability of the spacer layer 112, the thermal stability of the MTJ 104 can be improved. For example, the amount of time which the MTJ 104 can withstand high temperatures can be increased. Thus, the number of BEOL interconnect layers than can be formed over the MTJ 104 can be increased.

In addition, by including the transition metal(s) with the magnesium in the spacer layer 112, the magnesium in the spacer layer 112 has a reduced susceptibility to oxidation. Thus, a performance of the MTJ 104 can be improved.

In some embodiments, the thickness of the spacer layer 112 ranges from 5%-100% of the sum of the thickness of the first free magnetic layer 110 and the thickness of the second free magnetic layer 114, the thickness of the spacer layer 112 ranges from 10%-90% of the sum of the thickness of the first free magnetic layer 110 and the thickness of the second free magnetic layer 114, or the thickness of the spacer layer 112 is some other suitable value. For example, in some embodiments, the thickness of the spacer layer 112 ranges from 0.1 nanometers to 1 nanometer, from 0.2 nanometers to 0.9 nanometers, or some other suitable range and the sum of the thickness of the first free magnetic layer 110 and the thickness of the second free magnetic layer 114 ranges from 1 nanometer to 2 nanometers, from 1.2 nanometers to 1.8 nanometers, or some other suitable range. If the thickness of the spacer layer 112 is too low (e.g., less than 5% of the sum of the thickness of the first free magnetic layer 110 and the thickness of the second free magnetic layer 114), a rate of boron diffusion from the first free magnetic layer 110 may be increased and thus the thermal stability of the MTJ 104 may be reduced. If the thickness of the spacer layer 112 is too high (e.g., greater than 100% of the sum of the thickness of the first free magnetic layer 110 and the thickness of the second free magnetic layer 114), the magnetic coupling between the free magnetic layers 110, 114 may be reduced and thus a performance of the MTJ 104 may be reduced.

In some embodiments, the atomic ratio of the magnesium to the transition metal(s) in the spacer layer 112 ranges from 10%-90%, from 15% to 80%, or some other suitable range. In some embodiments, if the atomic ratio of the magnesium to the transition metal(s) is too high (e.g., greater than 90% magnesium, greater than 80% magnesium, or some other suitable value), the magnesium may have an increased susceptibility to oxidization and thus a performance of the MTJ 104 may be reduced. If the atomic ratio of the magnesium to the transition metal(s) is too low (e.g., greater than 90% transition metal(s), greater than 85% transition metal (s), or some other suitable value), the magnetic coupling between the free magnetic layers 110, 114 may be reduced.

In some embodiments, the first electrode layer 102 and the second electrode layer 118 comprise metals such as, for example, copper, aluminum, tungsten, ruthenium, or some other suitable materials. In some embodiments, the reference magnetic layer 106, the first free magnetic layer 110, and the second free magnetic layer 114 comprise ferromagnetic materials such as, for example, cobalt-iron-boron or some other suitable material. In some embodiments, the barrier layer 108 and the cap layer 116 comprise dielectric materials such as, for example, magnesium oxide or some other suitable material.

Figure 2:
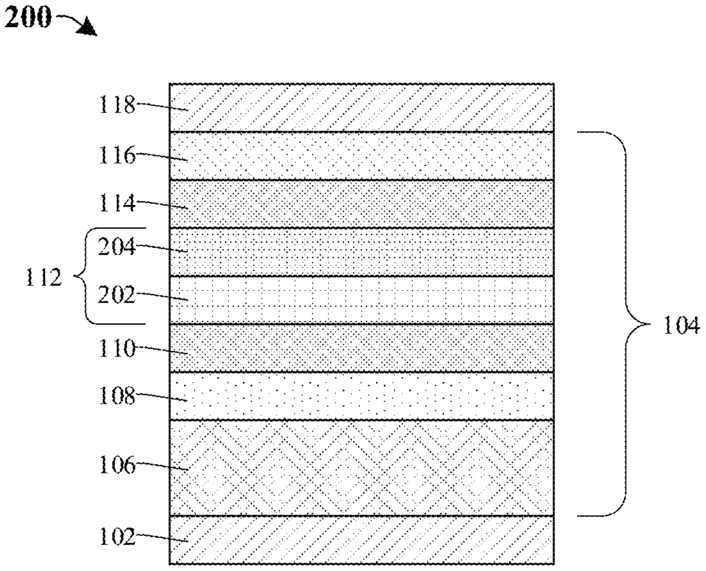
FIG. 2 illustrates a cross-sectional view of some embodiments of the memory device of FIG. 1 in which the spacer layer comprises a first spacer film and a second spacer film.

FIG. 2 illustrates a cross-sectional view 200 of some embodiments of the memory device of FIG. 1 in which the spacer layer 112 comprises a first spacer film 202 and a second spacer film 204.

The first spacer film 202 is over the first free magnetic layer 110. The second spacer film 204 is over the first spacer film 202. The second free magnetic layer 114 is over the second spacer film 204. The first spacer film 202 comprises a first material and the second spacer film 204 comprises a second material, different than the first material.

In some embodiments, the first spacer film 202 comprises magnesium and the second spacer film 204 comprises a transition metal (e.g., tungsten, molybdenum, tantalum, hafnium, or the like). In some other embodiments, the first spacer film 202 comprises a transition metal (e.g., tungsten, molybdenum, tantalum, hafnium, or the like) and the second spacer film 204 comprises magnesium. In some other embodiments, the first spacer film 202 comprises magnesium and a first transition metal, and the second spacer film 204 comprises magnesium and a second transition metal, different than the first transition metal.

Figure 3:
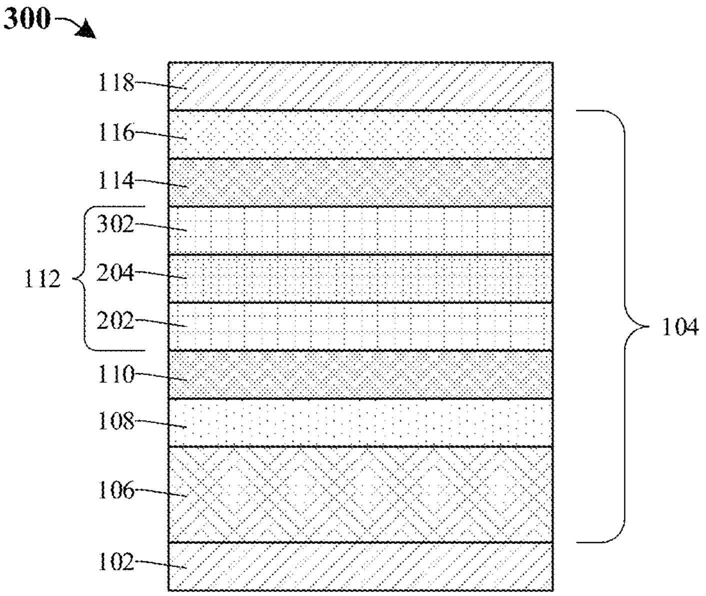
FIG. 3 illustrates a cross-sectional view of some embodiments of the memory device of FIG. 2 in which the spacer layer further comprises a third spacer film.

FIG. 3 illustrates a cross-sectional view 300 of some embodiments of the memory device of FIG. 2 in which the spacer layer further comprises a third spacer film 302.

The third spacer film 302 is between the second spacer film 204 and the second free magnetic layer 114. The second spacer film 204 comprises a different material than the first spacer film 202 and the third spacer film 302. For example, first spacer film 202 comprises a first material, the second spacer film 204 comprises a second material, and the third spacer film 302 comprises a third material, where the second material is different from the first material and the third material. In some embodiments, the third material is the same as the first material.

In some embodiments, the first spacer film 202 comprises magnesium, the second spacer film 204 comprises a transition metal (e.g., tungsten, molybdenum, tantalum, hafnium, or the like), and the third spacer film 302 comprises magnesium. In some other embodiments, the first spacer film 202 comprises a transition metal, the second spacer film 204 comprises magnesium, and the third spacer film 302 comprises a transition metal. In some other embodiments, the first spacer film 202 comprises magnesium and a first transition metal, the second spacer film 204 comprises magnesium and a second transition metal, and the third spacer film 302 comprises magnesium and a third transition metal, where the second transition metal is different than the first transition metal and the third transition metal.

Figure 4:
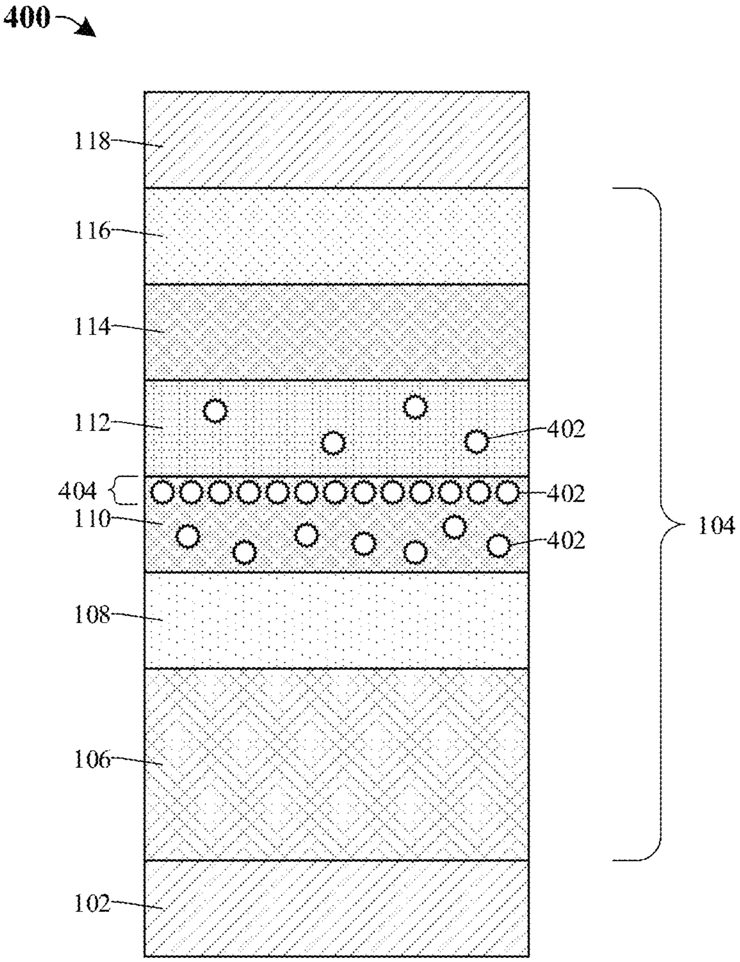
FIG. 4 illustrates a cross-sectional view of some embodiments of the memory device of FIG. 1 in which atoms from the first free magnetic layer are accumulated along an interface between the first free magnetic layer and the spacer layer.

FIG. 4 illustrates a cross-sectional view 400 of some embodiments of the memory device of FIG. 1 in which atoms 402 from the first free magnetic layer 110 are accumulated along the interface between the first free magnetic layer 110 and the spacer layer 112.

For example, a plurality of boron atoms 402 are within the first free magnetic layer 110 along the top surface of the first free magnetic layer 110 where the first free magnetic layer 110 borders the spacer layer 112. This region along the top surface of the first free magnetic layer 110 where the boron atoms 402 are accumulated may be referred to as a boron accumulation region 404. These atoms 402 may accumulate along the interface (e.g., at the accumulation region 404) due to being blocked at the interface by the spacer layer 112. In some embodiments, a concentration of boron atoms 402 in the first free magnetic layer 110 decreases as a distance from the interface between the first free magnetic layer 110 and the spacer layer 112.

In some embodiments, a plurality of boron atoms 402 are within the spacer layer 112. These atoms have diffused into the spacer layer 112 from the first free magnetic layer 110. In some embodiments, the concentration of boron atoms in the spacer layer 112 decreases as the distance from the first free magnetic layer 110 increases. Further, in some embodiments where the spacer layer 112 includes multiple spacer films (e.g., as illustrated in FIG. 2 and FIG. 3), the concentration of boron in the spacer layer 112 may be higher in the spacer film closest to the first free magnetic layer 110 and may decrease across the spacer films as the distance from the first free magnetic layer 110 increases. For example, in some embodiments, the concentration of boron atoms in the first spacer film (e.g., 202 of FIG. 2 and FIG. 3) is greater than the concentration of boron atoms in the second spacer film (e.g., 204 of FIG. 2 and FIG. 3), and the concentration of boron atoms in the second spacer film (e.g., 204 of FIG. 2 and FIG. 3) is greater than the concentration of boron atoms in the third spacer film (e.g., 302 FIG. 3).

Figure 5:
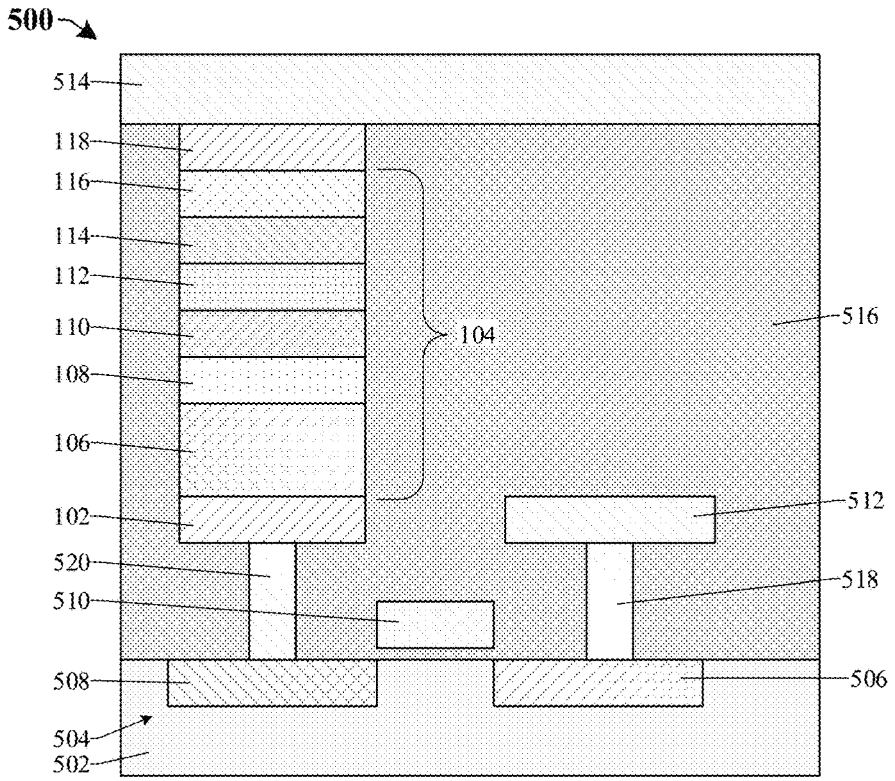
FIG. 5 illustrates a cross-sectional view of some embodiments of an integrated chip including the memory device of FIG. 1.
Figure 6:
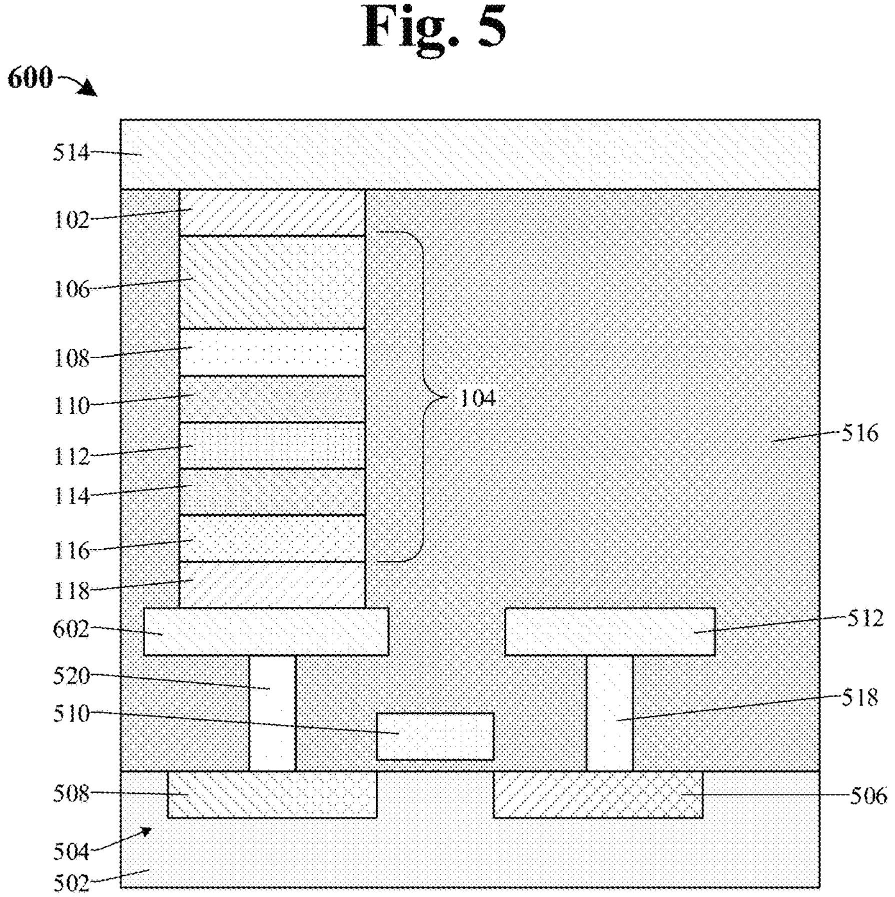
FIG. 6 illustrates a cross-sectional view of some other embodiments of an integrated chip including the memory device of FIG. 1.

FIG. 5 illustrates a cross-sectional view 500 of some embodiments of an integrated chip including the memory device of FIG. 1. FIG. 6 illustrates a cross-sectional view 600 of some other embodiments of an integrated chip including the memory device of FIG. 1.

In some embodiments (e.g., as illustrated in FIG. 5), the integrated chip includes an spin-transfer torque (STT) magnetoresistive random-access memory (MRAM) device in which the MTJ 104 is coupled between a transistor device 504 and a bit line 514. For example, the transistor device 504 is disposed along a semiconductor substrate 502. The transistor device 504 includes a first source/drain region 506, a second source/drain region 508, and a gate layer 510. A dielectric structure 516 comprising one or more dielectric layers is over the substrate 502. A source line 512 is over the substrate 502 and within the dielectric structure 516. The source line 512 is coupled to the first source/drain region 506 by an interconnect 518 (e.g., a metal contact or the like). The MTJ 104 is over the substrate 502 and within the dielectric structure 516. The first electrode layer 102 is coupled to a second source/drain region 508 by an interconnect 520 (e.g., a metal contact or the like). The bit line 514 is over the MTJ 104 and within the dielectric structure 516. The second electrode layer 118 is coupled to the bit line 514. In some embodiments, the gate layer 510 forms a word line. In some other embodiments, the gate layer 510 is coupled to a word line (not shown).

In some embodiments (e.g., as illustrated in FIG. 6), the integrated chip includes an spin-orbit torque (SOT) magnetoresistive random-access memory (MRAM) device in which the MTJ 104 is coupled between a write word line 602 and the bit line 514. In some embodiments, the orientation of the MTJ 104 is inverted so that the reference magnetic layer 106 is over the free magnetic layers 110, 114. The write word line 602 is coupled to the second source/drain region 508 and the second electrode layer 118. The bit line 514 is coupled to the first electrode layer 102. In some embodiments, the gate layer 510 forms a read word line. In some other embodiments, the gate layer 510 is coupled to a read word line (not shown).

In some embodiments, the transistor device 504 is a metal-oxide field effect transistor, a junction field effect transistor, a fin field effect transistor, a gate all-around field effect transistor, or some other suitable device. In some embodiments, source/drain region(s) may refer to a source or a drain, individually or collectively dependent upon the context. In some embodiments, the source line 512, the bit line 514, and the write word line 602 comprise metals (e.g., copper, tungsten, aluminum, or the like) or some other suitable material.

FIGS. 7-13 illustrate cross-sectional views 700-1300 of some embodiments of a method for forming a memory device comprising a magnetic tunnel junction (MTJ) 104, the MTJ 104 comprising a spacer layer 112 between a first free magnetic layer 110 and a second free magnetic layer 114. Although FIGS. 7-13 are described in relation to a method, it will be appreciated that the structures disclosed in FIGS. 7-13 are not limited to such a method, but instead may stand alone as structures independent of the method.

Figure 7:
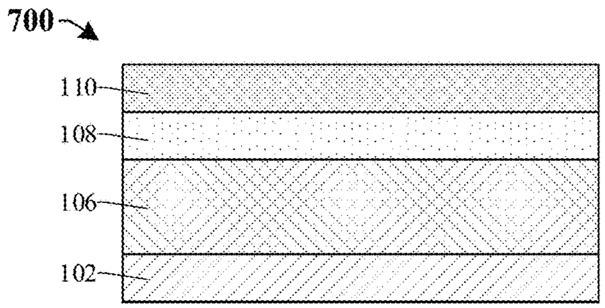
FIGS. 7-13 illustrate cross-sectional views of some embodiments of a method for forming a memory device comprising a magnetic tunnel junction (MTJ), the MTJ comprising a spacer layer between a first free magnetic layer and a second free magnetic layer.

As shown in cross-sectional view 700 of FIG. 7, a reference magnetic layer 106 is deposited over a first electrode layer 102. In some embodiments, the first electrode layer 102 comprises copper, tungsten, aluminum, or some other suitable material. In some embodiments, the reference magnetic layer 106 comprises cobalt-iron-boron or some other suitable material. In some embodiments, the reference magnetic layer 106 is deposited over by a chemical vapor deposition (CVD) process, a physical vapor deposition (PVD) process, an atomic layer deposition (ALD) process, or some other suitable process.

Further, a barrier layer 108 is deposited over the reference magnetic layer 106. In some embodiments, the barrier layer 108 comprises magnesium oxide or some other suitable material. In some embodiments, the barrier layer 108 is deposited by a CVD process, a PVD process, an ALD process, or some other suitable process.

Furthermore, a first free magnetic layer 110 is deposited over the barrier layer 108. In some embodiments, the first free magnetic layer 110 comprises cobalt-iron-boron or some other suitable material. In some embodiments, the first free magnetic layer 110 is deposited by a CVD process, a PVD process, an ALD process, or some other suitable process.

Figure 8:
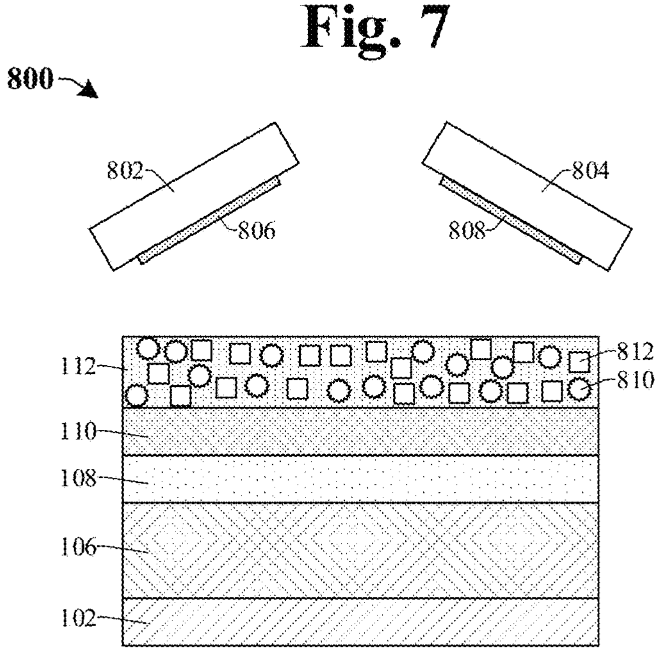

FIG. 8 illustrates a cross-sectional view 800 some embodiments of a first method for forming the spacer layer 112 over the first free magnetic layer 110. As shown in cross-sectional view 800 of FIG. 8, the spacer layer 112 is deposited by a co-sputtering process in which two or more sputtering guns 802, 804 (e.g., a magnetron cathodes) are used concurrently. For example, a first sputtering gun 802 has a magnesium target layer 806 and a second sputtering gun 804 has a transition metal target layer 808. Atoms from both target layers 806, 808 are sputtered concurrently (e.g., simultaneously) over the first free magnetic layer 110 to form the spacer layer 112. Thus, in some embodiments, the spacer layer 112 comprises a varying arrangement of magnesium atoms 810 and transition metal atoms 812.

Figure 9:
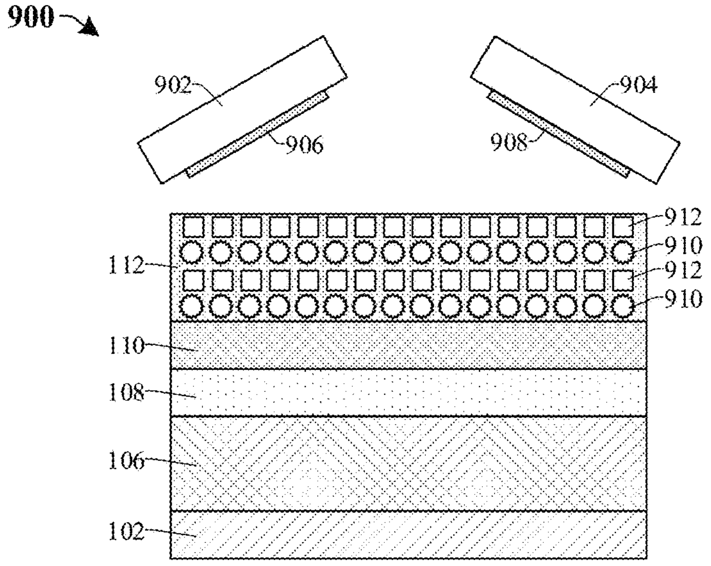

FIG. 9 illustrates a cross-sectional view 900 some embodiments of a second method for forming the spacer layer 112 over the first free magnetic layer 110. As shown in cross-sectional view 900 of FIG. 9, the spacer layer 112 is deposited by an alternating sputtering process in which two or more sputtering guns 902, 904 are used in an alternating manner. For example, a first sputtering gun 902 has a magnesium target layer 906 and a second sputtering gun 904 has a transition metal target layer 908. Atoms from both target layers 906, 908 are sputtered in an alternating manner over the first free magnetic layer 110 to form the spacer layer 112. For example, for a first period of time, atoms from one of the target layers (e.g., 906) are sputtered over the first free magnetic layer 110 and for a subsequent second period of time, atoms from another of the target layers (e.g., 908) are sputtered over the first free magnetic layer 110. Thus, in some embodiments, the spacer layer 112 comprises an alternating stack of thin films of magnesium atoms 910 and thin films of transition metal atoms 912.

Figure 10:
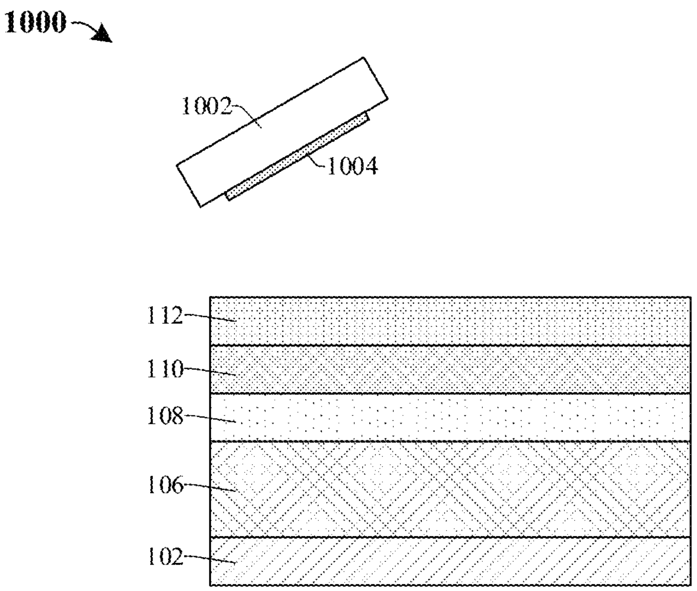

FIG. 10 illustrates a cross-sectional view 1000 some embodiments of a third method for forming the spacer layer 112 over the first free magnetic layer 110. As shown in cross-sectional view 1000 of FIG. 10, the spacer layer 112 is deposited by a direct sputtering process in which a single sputtering gun 1002 is used. For example, a sputtering gun 1002 having a target layer 1004 comprising both magnesium and a transition metal is used. Atoms from the target layer 1004 are sputtered over the first free magnetic layer 110.

The spacer layer 112 is formed so that the atomic ratio of magnesium to the transition metal in the spacer layer 112 ranges from 10%-90%, from 15% to 80%, or some other suitable range. Further, spacer layer 112 is formed so that the thickness of the spacer layer 112 ranges from 5%-100% of the sum of the thickness of the first free magnetic layer 110 and the thickness of the second free magnetic layer 114, from 10%-90% of the sum, or some other suitable percentage of the sum. For example, in some embodiments, the thickness of the spacer layer 112 ranges from 0.1 nanometers to 1 nanometer, from 0.2 nanometers to 0.9 nanometers, or some other suitable range and the sum of the thickness of the first free magnetic layer 110 and the thickness of the second free magnetic layer 114 ranges from 1 nanometer to 2 nanometers, from 1.2 nanometers to 1.8 nanometers, or some other suitable range.

In some embodiments, multiple spacer films (e.g., first spacer film 202, second spacer film 204, and third spacer film 302 of FIG. 2 and FIG. 3) having various materials are deposited over the first free magnetic layer 110. For example, a first spacer film comprising a first material is deposited over the first free magnetic layer 110, a second spacer film comprising a second material, different than the first material, is deposited over the first spacer film, and a third spacer film comprising a third material, different than the second material, is deposited over the second spacer film. In some embodiments, the alternating sputtering process is used to form the stack of spacer films.

Figure 11:
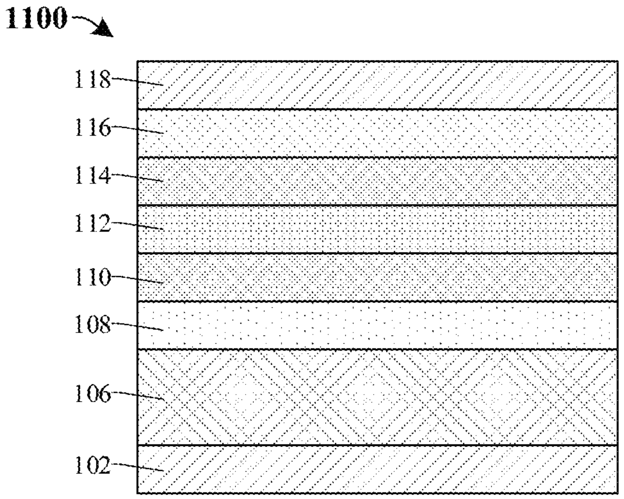

As shown in cross-sectional view 1100 of FIG. 11, a second free magnetic layer 114 is deposited over the spacer layer 112. In some embodiments, the second free magnetic layer 114 comprises cobalt-iron-boron or some other suitable material. In some embodiments, the second free magnetic layer 114 is deposited by a CVD process, a PVD process, an ALD process, or some other suitable process.

A cap layer 116 is deposited over the second free magnetic layer 114. In some embodiments, the cap layer 116 comprises magnesium oxide or some other suitable material. In some embodiments, the cap layer 116 is deposited by a CVD process, a PVD process, an ALD process, or some other suitable process.

A second electrode layer 118 is deposited over the cap layer 116. In some embodiments, the second electrode layer 118 comprises copper, tungsten, aluminum, or some other suitable material. In some embodiments, the second electrode layer 118 is deposited by a CVD process, a PVD process, an ALD process, or some other suitable process.

Figure 12:
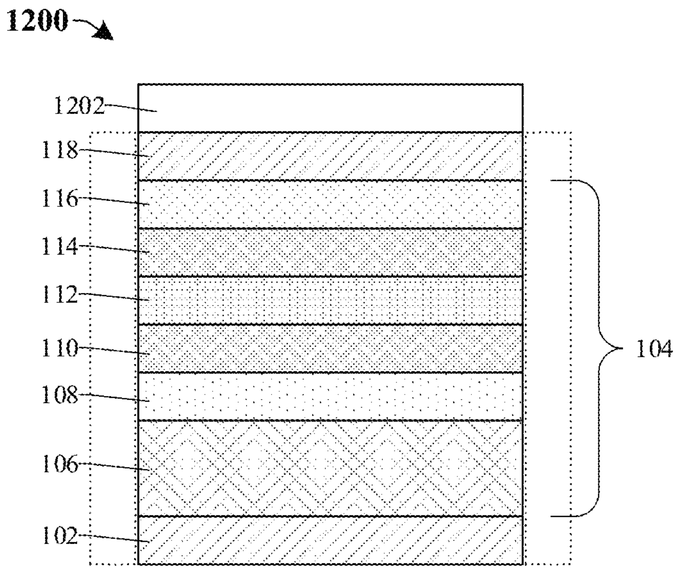

As shown in cross-sectional view 1200 of FIG. 12, the second electrode layer 118, the cap layer 116, the second free magnetic layer 114, the spacer layer 112, the first free magnetic layer 110, the barrier layer 108, the reference magnetic layer 106, and the first electrode layer 102 are etched to delimit the MTJ 104. In some embodiments, a masking layer 1202 is formed over the second electrode layer 118 and the etching is performed according to the masking layer 1202. In some embodiments, the masking layer 1202 may, for example, comprise a photoresist mask, a hard mask, or the like. In some embodiments, the etching comprises one or more dry etching processes (e.g., plasma etching, reactive ion etching, ion beam etching, or the like) or some other suitable etching processes. In some embodiments, the masking layer 1202 is removed during and/or after the etching.

Figure 13:
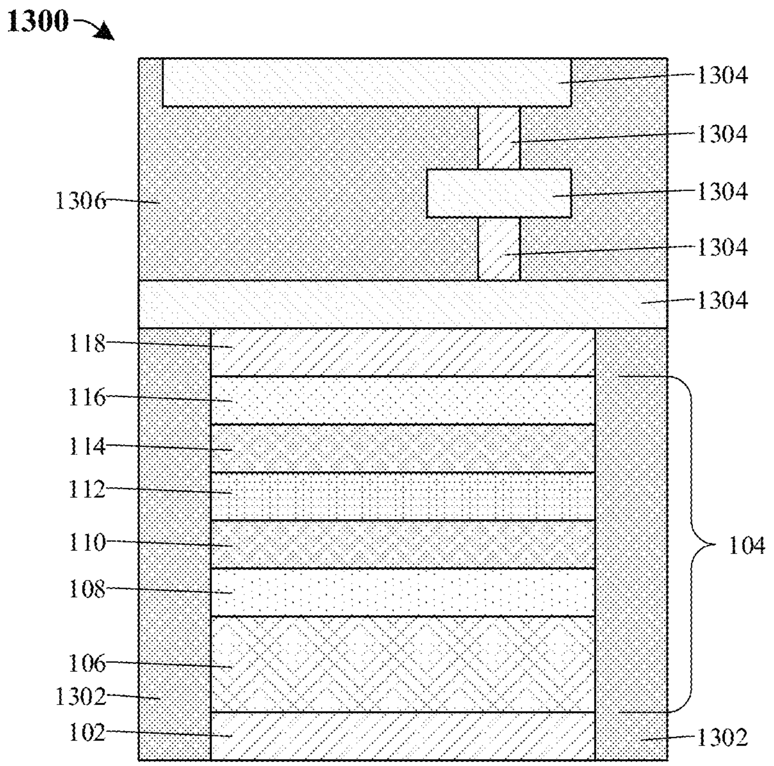

As shown in cross-sectional view 1300 of FIG. 13, a dielectric layer 1302 is deposited over the MTJ 104 and on opposite sides of the MTJ 104. Further, a plurality of metal interconnects 1304 are formed over the MTJ 104 within a dielectric structure 1306. During the formation of the metal interconnects 1304, the MTJ 104 is exposed to high temperatures (e.g., temperatures greater than 400 degrees Celsius) for a prolonged period of time (e.g., greater than 5 hours, greater than 6 hours, greater than 7 hours, or some other suitable time).

In some embodiments, some boron atoms from the first free magnetic layer 110 diffuse out of the first free magnetic layer 110 during the formation of the metal interconnects 1304 (e.g., while the MTJ 104 is exposed to the high temperatures). By including the spacer layer 112 over the first free magnetic layer 110, the rate at which the boron diffuses out of the first free magnetic layer 110 can be reduced. In some embodiments, boron atoms are arranged within the spacer layer 112 after the BEOL interconnect formation as a result of diffusion. In some embodiments, boron atoms accumulate along the interface between the first free magnetic layer 110 and the spacer layer 112 during the BEOL formation (e.g., as illustrated in FIG. 4).

In some embodiments, the data retention of the MTJ 104 after the exposure to high temperatures is substantially the same as before the exposure due to improved thermal stability provided by the spacer layer 112. For example, in some embodiments, the MTJ 104 has a first energy barrier (e.g., the amount of energy required to change the state of the MTJ from a parallel magnetic state to an anti-parallel magnetic state, or vice versa) before the forming of the BEOL interconnects 1304 and a second energy barrier after the forming of the BEOL interconnects 1304 (e.g., after the exposure to the high temperatures for the prolonged period of time), where the first energy barrier is approximately equal to the second energy barrier. In some embodiments, a difference between the first energy barrier and the second energy barrier is less than 10%, less than 5%, or some other suitable value. Thus, the spacer layer 112 can prevent reduction of the data retention of the MTJ 104 during the exposure to high temperatures.

Figure 14:
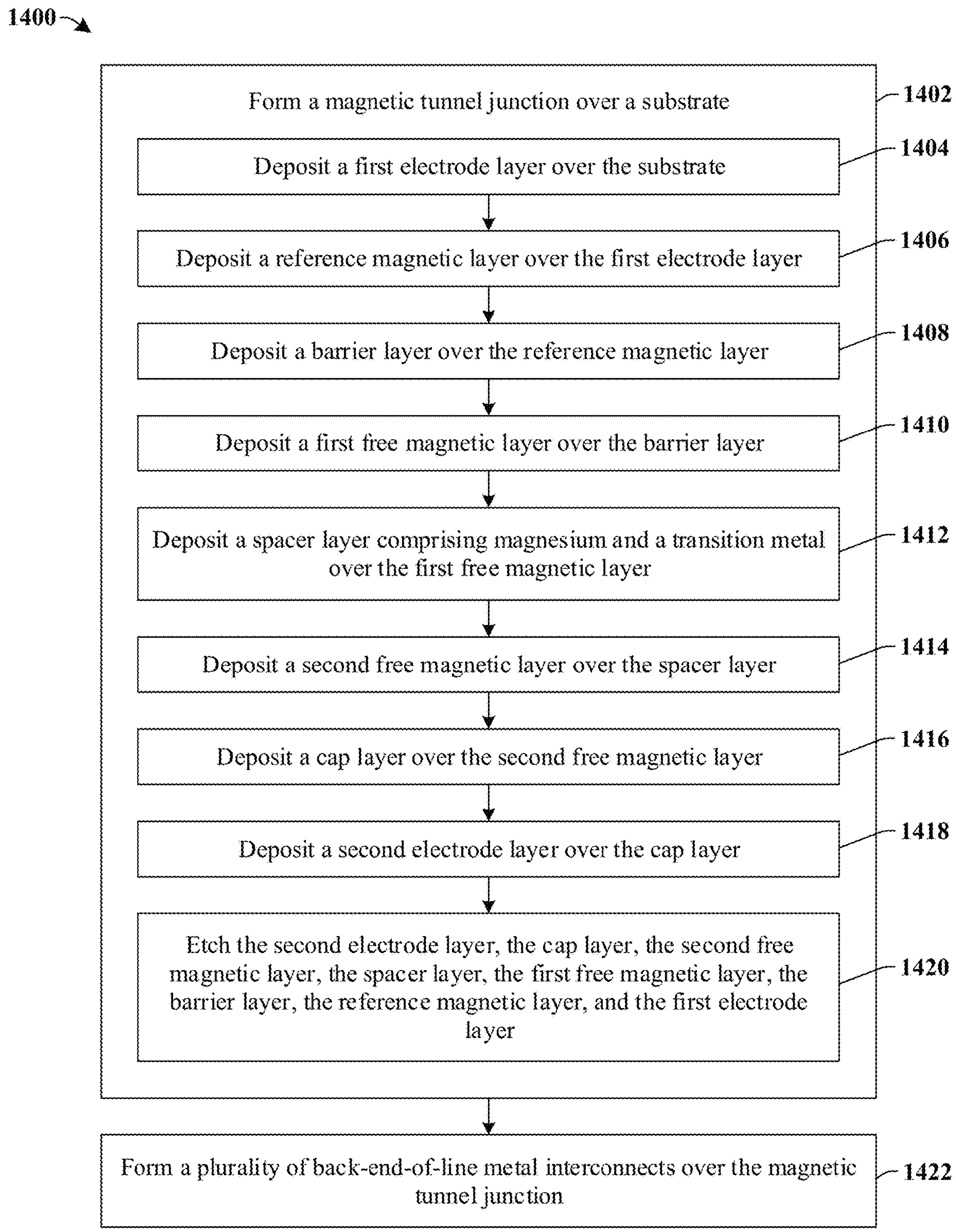
FIG. 14 illustrates a flow diagram of some embodiments of a method for forming a memory device comprising a magnetic tunnel junction (MTJ), the MTJ comprising a spacer layer between a first free magnetic layer and a second free magnetic layer.

FIG. 14 illustrates a flow diagram of some embodiments of a method 1400 for forming a memory device comprising a magnetic tunnel junction (MTJ), the MTJ comprising a spacer layer between a first free magnetic layer and a second free magnetic layer. While method 1400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 1402, form a magnetic tunnel junction over a substrate. FIGS. 7-12 illustrate cross-sectional views 700-1200 of some embodiments corresponding to block 1402. In some embodiments, block 1402 includes blocks 1404-1420.

At block 1404, deposit a first electrode layer over the substrate. FIG. 7 illustrates a cross-sectional view 700 of some embodiments corresponding to block 1404.

At block 1406, deposit a reference magnetic layer over the first electrode layer. FIG. 7 illustrates a cross-sectional view 700 of some embodiments corresponding to block 1406.

At block 1408, deposit a barrier layer over the reference magnetic layer. FIG. 7 illustrates a cross-sectional view 700 of some embodiments corresponding to block 1408.

At block 1410, deposit a first free magnetic layer over the barrier layer. FIG. 7 illustrates a cross-sectional view 700 of some embodiments corresponding to block 1410.

At block 1412, deposit a spacer layer comprising magnesium and a transition metal over the first free magnetic layer. FIGS. 8-10 illustrate cross-sectional views 800-1000 of various embodiments corresponding to block 1412. For example, in some embodiments, the spacer layer is deposited using a co-sputtering process (e.g., as illustrated in FIG. 8). In some other embodiments, the spacer layer is deposited using an alternating sputtering process (e.g., as illustrated in FIG. 9). In yet other embodiments, the spacer layer is deposited using a direct sputtering process (e.g., as illustrated in FIG. 10). In some embodiments, depositing the spacer layer comprises depositing a plurality of spacer films (e.g., as illustrated in FIG. 2 and FIG. 3).

At block 1414, deposit a second free magnetic layer over the spacer layer. FIG. 11 illustrates a cross-sectional view 1100 of some embodiments corresponding to block 1414.

At block 1416, deposit a cap layer over the second free magnetic layer. FIG. 11 illustrates a cross-sectional view 1100 of some embodiments corresponding to block 1416.

At block 1418, deposit a second electrode layer over the cap layer. FIG. 11 illustrates a cross-sectional view 1100 of some embodiments corresponding to block 1418.

At block 1420, etch the second electrode layer, the cap layer, the second free magnetic layer, the spacer layer, the first free magnetic layer, the barrier layer, the reference magnetic layer, and the first electrode layer. The etching delimits the magnetic tunnel junction. FIG. 12 illustrates a cross-sectional view 1200 of some embodiments corresponding to block 1420.

At block 1422, form a plurality of back-end-of-line metal interconnects over the magnetic tunnel junction. In some embodiments, the magnetic tunnel junction is exposed to high temperatures during the BEOL interconnect fabrication. Because the spacer layer improves the thermal stability of the magnetic tunnel junction, the magnetic tunnel junction is able to withstand the BEOL interconnect fabrication without suffering substantial performance degradation. FIG. 13 illustrates a cross-sectional view 13 of some embodiments corresponding to block 1422.

Thus, the present disclosure relates to a magnetic tunnel junction including a spacer layer and a method for forming the magnetic tunnel junction, the spacer layer comprising magnesium and a transition metal to reduce diffusion in the magnetic tunnel junction.

Accordingly, in some embodiments, the present disclosure relates to an integrated chip including a reference magnetic layer and a barrier layer over the reference magnetic layer. A first free magnetic layer is over the barrier layer. A second free magnetic layer is over the first free magnetic layer. A spacer layer is between the first free magnetic layer and the second free magnetic layer. The spacer layer includes magnesium and a transition metal. An atomic ratio of the magnesium to the transition metal ranges from 15% to 80%.

In other embodiments, the present disclosure relates to a method for forming an integrated chip. The method includes depositing a reference magnetic layer over a substrate. A barrier layer is deposited over the reference magnetic layer. A first free magnetic layer is deposited over the barrier layer. A spacer layer is deposited over the first free magnetic layer. The spacer layer includes magnesium and a transition metal. An atomic ratio of the magnesium to the transition metal ranges from 15% to 80%. A second free magnetic layer is deposited over the spacer layer.

In yet other embodiments, the present disclosure relates to a method for forming an integrated chip. The method includes forming a magnetic tunnel junction (MTJ) over a substrate. Forming the MTJ includes depositing a reference magnetic layer over the substrate. A barrier layer is deposited over the reference magnetic layer. A first free magnetic layer is deposited over the barrier layer. A spacer layer is deposited over the first free magnetic layer. The spacer layer includes magnesium and a transition metal. A second free magnetic layer is deposited over the spacer layer. The method further includes forming a plurality of metal interconnects over the MTJ. The MTJ has a first energy barrier before the forming of the metal interconnects and a second energy barrier after the forming of the metal interconnects. A difference between the first energy barrier and the second energy barrier is less than 10%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:

depositing a reference magnetic layer over a substrate;

depositing a barrier layer over the reference magnetic layer;

depositing a first free magnetic layer over the barrier layer, the first free magnetic layer comprising boron;

depositing a spacer layer over the first free magnetic layer, the spacer layer comprising magnesium and a transition metal, wherein an atomic ratio of the magnesium to the transition metal ranges from 15% to 80%; and depositing a second free magnetic layer over the spacer layer, wherein boron atoms in the first free magnetic layer diffuse toward the spacer layer after the spacer layer is deposited, and wherein a concentration of boron atoms in the first free magnetic layer decreases as a distance from the spacer layer increases after the spacer layer is deposited.

2. The method of claim 1, wherein the depositing of the spacer layer comprises sputtering the magnesium over the first free magnetic layer using a first sputtering gun and concurrently sputtering the transition metal over the first free magnetic layer using a second sputtering gun.

3. The method of claim 1, wherein the depositing of the spacer layer comprises alternating between sputtering the magnesium over the first free magnetic layer using a first sputtering gun and sputtering the transition metal over the first free magnetic layer using a second sputtering gun.

4. The method of claim 1, wherein the depositing of the spacer layer comprises sputtering both the magnesium and the transition metal using a sputtering gun having a target layer comprising both the magnesium and the transition metal.

5. The method of claim 1, wherein the depositing of the spacer layer comprises depositing a first spacer film over the first free magnetic layer and depositing a second spacer film over and contacting the first spacer film, the first spacer film comprising a first material and the second spacer film comprising a second material, different than the first material.

6. The method of claim 5, wherein the depositing of the spacer layer further comprises depositing a third spacer film over and contacting the second spacer film, the third spacer film comprising a third material, different than the second material.

7. The method of claim 1, wherein boron atoms from the first free magnetic layer diffuse into the spacer layer after the spacer layer is deposited, and wherein a concentration of boron atoms in the spacer layer decreases as a distance from the first free magnetic layer increases after the spacer layer is deposited.

8. A method for forming an integrated chip, the method comprising:

forming a magnetic tunnel junction (MTJ) over a substrate, the forming of the MTJ comprising:

depositing a reference magnetic layer over the substrate;

depositing a barrier layer over the reference magnetic layer;

depositing a first free magnetic layer over the barrier layer, the first free magnetic layer comprising boron;

depositing a spacer layer over the first free magnetic layer, the spacer layer comprising magnesium and a transition metal; and depositing a second free magnetic layer over the spacer layer; and forming a plurality of metal interconnects over the MTJ, wherein the MTJ has a first energy barrier before the forming of the metal interconnects over the MTJ, and wherein the MTJ has a second energy barrier, different than the first energy barrier, after the forming of the metal interconnects over the MTJ, and wherein a difference between the first energy barrier and the second energy barrier is less than 10%, wherein boron atoms from the first free magnetic layer diffuse into the spacer layer after the plurality of metal interconnects are formed so that the spacer layer further comprises boron and a concentration of boron atoms in the spacer layer decreases as a distance from the first free magnetic layer increases.

9. The method of claim 8, wherein the MTJ is exposed to temperatures greater than 400 degrees Celsius during the forming of the metal interconnects.

10. The method of claim 8, wherein a thickness of the spacer layer ranges from 5%-100% of a sum of a thickness of the first free magnetic layer and a thickness of the second free magnetic layer.

11. The method of claim 8, wherein boron atoms in the first free magnetic layer diffuse toward the spacer layer after the plurality of metal interconnects are formed so that a concentration of boron atoms in the first free magnetic layer decreases as a distance from the spacer layer increases.

12. A method for forming an integrated chip, the method comprising:

depositing a reference magnetic layer on a first electrode layer;

depositing a barrier layer on the reference magnetic layer;

depositing a first free magnetic layer on the barrier layer;

depositing a first spacer layer on the first free magnetic layer, the first spacer layer comprising one or both of magnesium and a first transition metal;

depositing a second spacer layer on the first spacer layer, the second spacer layer comprising one or both of magnesium and a second transition metal, wherein at least one of the first spacer layer and the second spacer layer comprises magnesium, and wherein at least one of the first spacer layer and the second spacer layer comprises transition metal, and wherein the first spacer layer extends from a top surface of the first free magnetic layer to a bottom surface of the second spacer layer;

depositing a second free magnetic layer over the second spacer layer; and depositing a cap layer on the second free magnetic layer; and depositing a second electrode layer on the cap layer.

13. The method of claim 12, wherein depositing the first spacer layer comprises sputtering magnesium on the first free magnetic layer using a first sputtering gun, and wherein depositing the second spacer layer comprises sputtering the second transition metal directly on the magnesium of the first spacer layer using a second sputtering gun.

14. The method of claim 12, wherein depositing the first spacer layer comprises sputtering the first transition metal on the first free magnetic layer using a first sputtering gun, and wherein depositing the second spacer layer comprises sputtering magnesium directly on the first transition metal using a second sputtering gun.

15. The method of claim 12, wherein depositing the first spacer layer comprises sputtering magnesium using a first sputtering gun and concurrently sputtering the first transition metal using a second sputtering gun, and wherein depositing the second spacer layer comprises sputtering magnesium using the first sputtering gun and concurrently sputtering the second transition metal using a third sputtering gun, and wherein the second transition metal is different than the first transition metal.

16. The method of claim 12, wherein depositing the first spacer layer comprises sputtering magnesium and the first transition metal using a first sputtering gun, and wherein depositing the second spacer layer comprises sputtering magnesium and the second transition metal using a second sputtering gun, and wherein the second transition metal is different than the first transition metal.

17. The method of claim 12, further comprising:

depositing a third spacer layer directly on the second spacer layer, wherein the second free magnetic layer is deposited on the third spacer layer, and wherein the first spacer layer consists essentially of magnesium, the second spacer layer consists essentially of the second transition metal, and the third spacer layer consists essentially of magnesium.

18. The method of claim 12, further comprising:

depositing a third spacer layer directly on the second spacer layer, wherein the second free magnetic layer is deposited on the third spacer layer, and wherein the first spacer layer consists essentially of the first transition metal, the second spacer layer consists essentially of magnesium, and the third spacer layer consists essentially of a third transition metal.

19. The method of claim 12, further comprising:

depositing a third spacer layer directly on the second spacer layer, wherein the second free magnetic layer is deposited on the third spacer layer, wherein the first spacer layer comprises magnesium and the first transition metal, the second spacer layer comprises magnesium and the second transition metal, and the third spacer layer comprises magnesium and a third transition metal, and wherein the second transition metal is different than the first transition metal and the third transition metal.

20. The method of claim 12, wherein the first spacer layer and the second spacer layer both comprise boron, and wherein a boron concentration in the first spacer layer is greater than a boron concentration in the second spacer layer.

* * * * *